US011006064B2

United States Patent
Yin et al.

(10) Patent No.: US 11,006,064 B2
(45) Date of Patent: May 11, 2021

(54) CMOS IMAGE SENSOR AND METHOD OF OPERATING PIXEL ARRAY BY CMOS IMAGE SENSOR

(71) Applicant: Taiwan Semiconductor Manufacturing Co., Ltd., Hsinchu (TW)

(72) Inventors: Chin Yin, Tainan (TW); Po-Sheng Chou, Hsinchu County (TW); Shang-Fu Yeh, Hsinchu (TW); Calvin Yi-Ping Chao, Hsinchu County (TW); Chih-Lin Lee, Miaoli County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/571,217

(22) Filed: Sep. 16, 2019

(65) Prior Publication Data
US 2021/0084247 A1    Mar. 18, 2021

(51) Int. Cl.
*H04N 5/357*      (2011.01)
*H04N 5/378*      (2011.01)
*H01L 27/146*     (2006.01)
*H04N 5/374*      (2011.01)
*H04N 5/359*      (2011.01)

(52) U.S. Cl.
CPC ....... *H04N 5/378* (2013.01); *H01L 27/14634* (2013.01); *H01L 27/14643* (2013.01); *H04N 5/359* (2013.01); *H04N 5/374* (2013.01)

(58) Field of Classification Search
CPC ...... H04N 5/357; H04N 5/3575; H04N 5/359; H04N 5/3597; H04N 5/363

USPC ........................................ 348/294, 300, 301
See application file for complete search history.

(56) References Cited

U.S. PATENT DOCUMENTS

| | | | |
|---|---|---|---|
| 8,077,236 B2 * | 12/2011 | Johnson | H04N 5/37452 348/294 |
| 9,888,197 B1 * | 2/2018 | Hynecek | H04N 5/363 |
| 2002/0113883 A1 * | 8/2002 | Zhang | H04N 5/365 348/241 |
| 2005/0082461 A1 * | 4/2005 | Bock | H04N 5/357 250/208.1 |
| 2016/0037114 A1 * | 2/2016 | Mandelli | H04N 5/232 250/208.1 |
| 2018/0063459 A1 * | 3/2018 | Stark | H01L 27/14612 |
| 2019/0110013 A1 * | 4/2019 | Shinohara | G01C 3/085 |
| 2019/0253647 A1 * | 8/2019 | Park | H01L 27/14665 |

* cited by examiner

Primary Examiner — Anthony J Daniels
(74) Attorney, Agent, or Firm — JCIPRNET

(57) ABSTRACT

A CMOS image sensor, and a method of operating a pixel array by a CMOS image sensor is provided. The CMOS image sensor includes a sensor, and a readout circuit. The sensor is configured to generate a first voltage signal and a first reset signal. The readout circuit is configured to perform a first readout operation by reading out the first reset signal and the first voltage signal simultaneously at a first predetermined time. After the first readout operation, the readout circuit turns on a plurality of switches to obtain a common-mode signal by making the first reset signal equal to the first voltage signal and re-perform a second readout operation by reading out the common-mode signal at a second predetermined time. The first predetermined time and the second predetermined time do not overlap each other.

18 Claims, 14 Drawing Sheets

CMOS IMAGE SENSOR AND METHOD OF OPERATING PIXEL ARRAY BY CMOS IMAGE SENSOR

BACKGROUND

In the field of CMOS image sensors, a global shutter CMOS image sensor is mostly preferred to capture fast-moving objects. The global shutter imager sensor is widely used in charge domain and voltage domain operations. In voltage domain, the global shutter image sensors are focused on reducing parasitic light sensitivity for backside illuminated structure, which in turn produce low signal to noise ratio and difficult to achieve the better image quality. On the contrary, the conventional charge domain global shutter can maintain the signal-to-noise ratio without signal degradation, but the high parasitic light sensitivity makes it not suitable to implement in back-side illumination structure. That is, the high image quality is not achieved because of the high parasitic light sensitivity or the low signal to noise ratio.

Therefore, there is a need to design the CMOS image sensor with low parasitic light leakage and high signal to noise ratio.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

Figure 1:
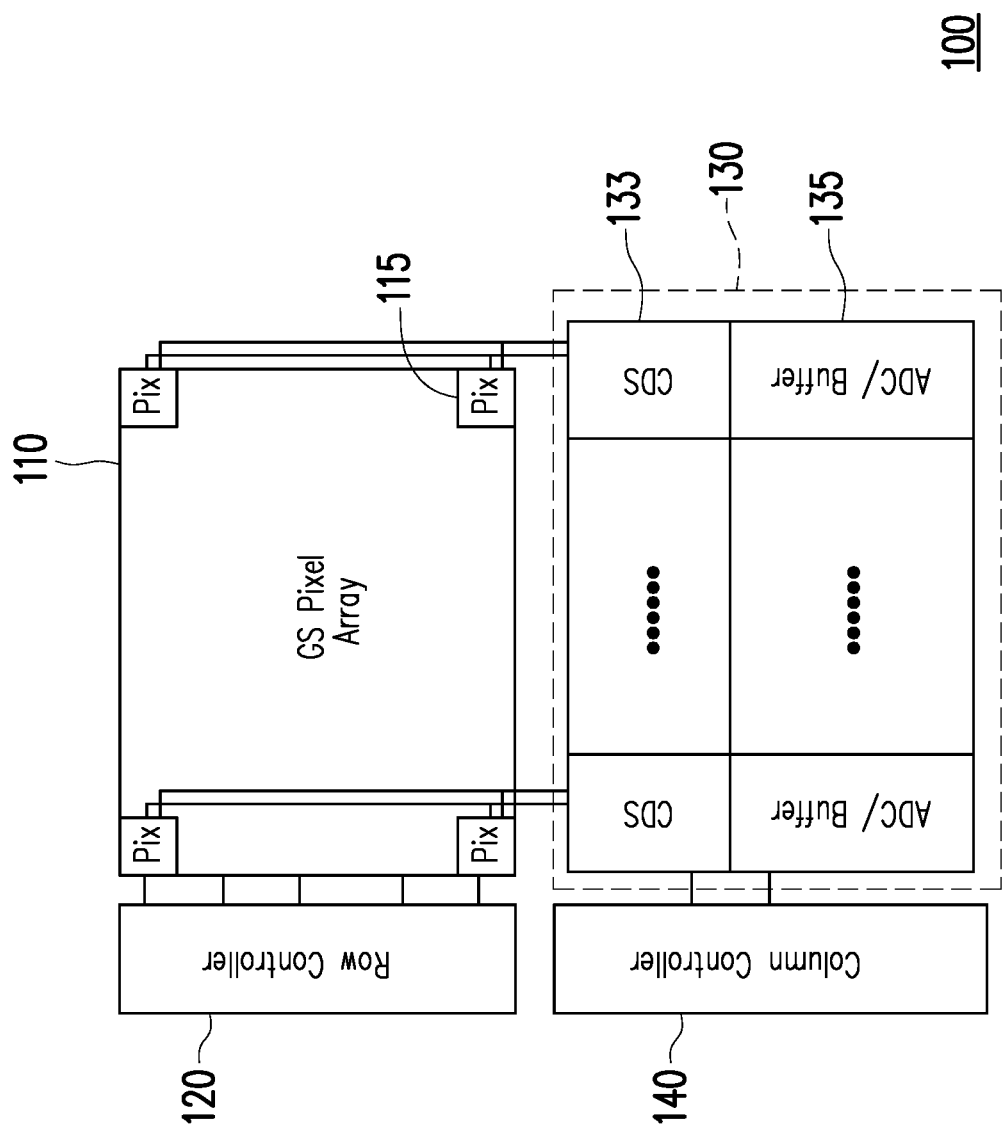
FIG. 1 illustrates a 2D layout block diagram of a CMOS image sensor according to an exemplary embodiment of the disclosure.

The following disclosure provides many different embodiments, or examples, for implementing different features of the present disclosure. Specific examples of components and arrangements are described below to simplify the present disclosure. These are, of course, merely examples and are not intended to be limiting. For example, the form formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a 2D layout block diagram of a CMOS image sensor 100 according to an exemplary embodiment of the disclosure. The CMOS image sensor array 100 includes a global shutter (GS) pixel array 110, a row controller 120, a readout circuit 130, and a column controller 140. The global shutter pixel array 110 has a plurality of pixel 115 array in M*N, where M denotes the row of the pixel array and N denotes the column of the pixel array. Each of the plurality of pixels (Pix) 115 in the global shutter pixel array 110 is controlled by row controller 120 and the column controller 140. The row controller 120 readouts the pixel 115 when the photosensitive device receives the incident light and generates the charge corresponding to the incident light. The column controller 140 maps the column pixel corresponding to the row in the global shutter pixel array 110. The readout circuit reads out the pixel charge/voltage in the corresponding row of the global shutter pixel array 110. The readout circuit 130 includes a correlated double sampling circuit (CDS) 133 and an analog-to-digital converter (ADC) 135. The readout circuit 130 reads out the charge/voltage signal and the reset signal simultaneously at the same time during the first readout operation. After the first readout operation, the common-mode signal is generated by an equalization operation, and the common mode signal is reading out by the readout circuit 130 in the second readout operation. It is noted that the first readout operation and the second readout operation do not overlap each other. Based on the above, the readout offset and the flicker noise are cancelled by double readout operation.

Figure 2:
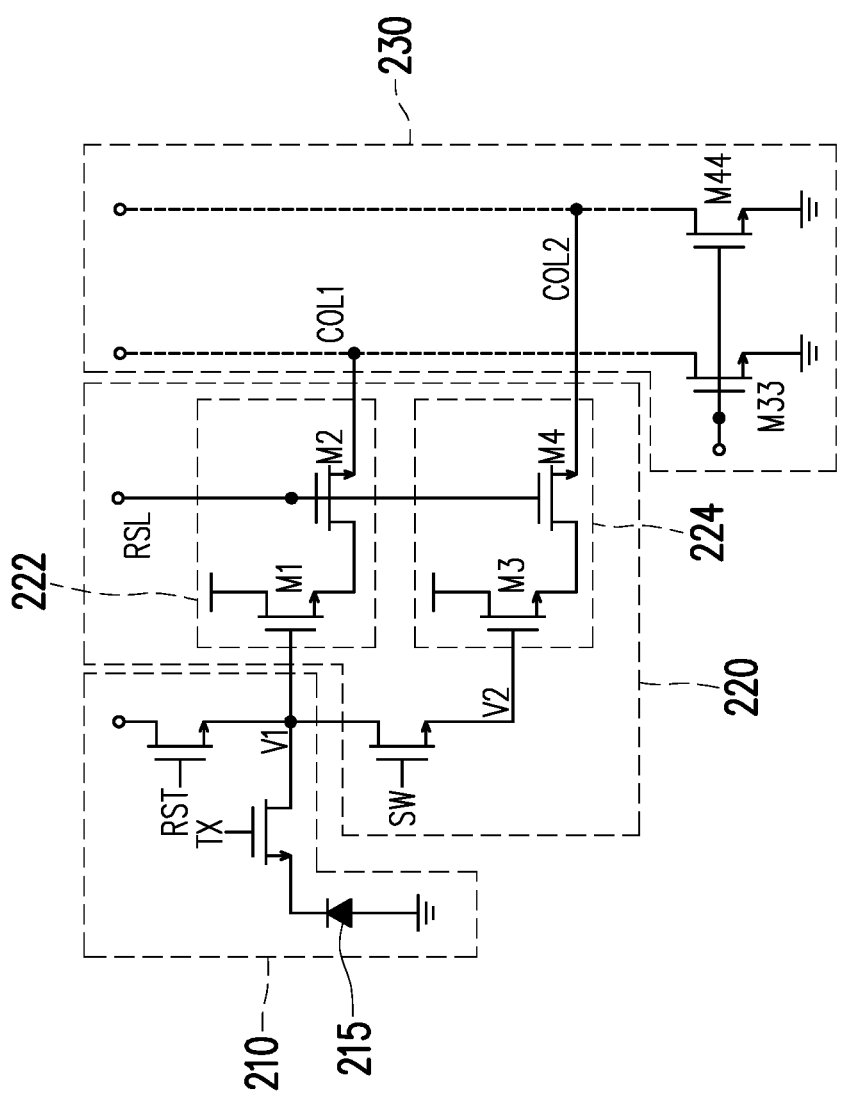
FIG. 2 illustrates a schematic circuit diagram of a CMOS image sensor according to an exemplary embodiment of the disclosure.

FIG. 2 illustrates a schematic circuit diagram of a CMOS image sensor 200 according to an exemplary embodiment of the disclosure. The CMOS image sensor 200 includes a sensor 210, a readout circuit 220, and a column readout circuit 230. The CMOS image sensor 200 is also defined as "7T" charge domain global shutter (CDGS) CMOS image sensor. The "7T" defines the number of active transistors presented in the structure. The sensor 210 is configured to generate a first charge signal and a first reset signal. The sensor 210 further includes a photosensitive device 215, a transmitter transistor TX, and a reset transistor RST. The photosensitive device 215 is a diode that receives an incident light and generates a charge/voltage corresponds to an incident light. In some embodiments, the photosensitive device 215 is presented as a photosensitive diode or the devices that are responsive to electromagnetic radiation in the visible, infrared, and/or ultraviolet spectral regions, thus the photosensitive device 215 used in the disclosure is not limited thereto. The transmitter transistor TX and the reset transistor RST are N-type Metal-Oxide-Semiconductor (NMOS) transistors, but a type of the transistors and number of transistors are not limited in the disclosure. The transmitter transistor TX is coupled to photosensitive device 215 and the reset transistor RST. The transmitter transistor TX receives the control signal to turn on the transmitter transistor TX, which transfers the charge accumulated in the photosensitive device 215 to a floating diffusion node V1. The floating diffusion node V1 has an intrinsic capacitance that stores the charge accumulated in the photosensitive device 215. The reset transistor RST is coupled between a power supply VDD and the floating diffusion node V1 to reset or charge the floating diffusion node V1. The control terminal of the reset transistor RST receives the reset signal to perform the reset or charge operation.

The readout circuit 220 further includes a first source follower 222, a second source follower 224 and a switch SW. The first source follower (SF1) 222 having a first transistor M1 and a second transistor M2. The first source follower 222 is configured to perform a first readout operation in the floating diffusion node V1. The drain terminal of the first transistor M1 and the drain terminal of the second transistor M2 are directly coupled to each other forms a source follower circuit 222. The control terminal of the first transistor M1 receives the control signal from the floating diffusion node V1 and the control terminal of the second transistor M2 receives the row select signal RSL to select the row of the pixel array. The second source follower (SF2) 224 having a third transistor M3 and a fourth transistor M4. Similarly, the drain terminal of the third transistor M3 and the drain terminal of the fourth transistor M4 are directly coupled to each other forms a source follower circuit 224. The second source follower 222 is configured to perform a second readout operation in the reset node V2. The column readout circuit 230 having a plurality of transistors M33, M44 to drive the corresponding column in response to the readout operation performed by the readout circuit 220. The transistors M33 and M44 are N-type Metal-Oxide-Semiconductor (NMOS) transistors, but the type of the transistors and the number of transistors are not limited in the disclosure.

After the integration time, the first charge signal and the first reset signal are stored in separate voltage nodes, the floating diffusion node V1 and the reset node V2 respectively, where the integration time is time taken for the photosensitive device 215 that receives the incident light and generate the charge/voltage corresponding to the incident light. Both floating diffusion node V1 and the reset node V2 are implemented by an intrinsic capacitance or a high density MIM capacitor, hence the type of capacitor used by the floating diffusion node V1 and the reset node V2 are not limited thereto. The readout circuit 220 is configured to perform a first readout operation (CDS1) by reading out a first reset signal and a first charge signal simultaneously at a first predetermined time, where the first predetermined time is the time taken to perform the first readout operation by the readout circuit 220. In detail, during the first predetermined time the reading out time of the first reset signal and the reading out time of the first charge signal simultaneously at the same time. During the first readout operation (CDS1) the output signal of the column readout circuit 220 is calculated as, $$V_{COL1} = V_1 + V_{leak1} + V_{SF1,offset} = V_{signal} + V_{leak1} + V_{SF1,offset} \quad (1)$$

$$V_{COL2} = V_2 + V_{leak2} + V_{SF2,offset} = V_{reset} + V_{leak2} + V_{SF2,offset} \quad (2)$$

Equation (1), shows the column readout transistor M33 performs the first readout operation at the floating diffusion node V1. Similarly, equation (2) shows the column readout transistor M44 performs the first readout operation at the reset node V2. After the first readout operation, the readout circuit 220 turns on the switch SW to obtain a common-mode signal by making the first reset signal equal to the first charge signal. In other words, the charge level of the first reset signal and the first charge signal are same after the first readout operation by turning on the switch SW. After obtaining the common-mode signal, the readout circuit 220 re-performs a second readout operation (CD2) by reading out the common-mode signal at a second predetermined time, where the second predetermined time is the time taken to perform the second readout operation by the readout circuit 220. The first predetermined time and the second predetermined time are performed at different times. The second predetermined time is always after the first predetermined time. In other words, the first predetermined time and the second predetermined time do not overlap each other. During the second readout operation (CDS2) the output signal of the column readout circuit 220 is calculated as, $$V_{COL1} = \tfrac{1}{2} \times (V_{reset} + V_{signal} + V_{leak1} + V_{leak2}) + V_{SF1,offset} \quad (3)$$

$$V_{COL2} = \tfrac{1}{2} \times (V_{reset} + V_{signal} + V_{leak1} + V_{leak2}) + V_{SF2,offset} \quad (4)$$

Equation (3), shows the column readout transistor M33 performs the second readout operation at the floating diffusion node V1. Similarly, equation (4) shows that the column readout transistor M44 performs the second readout operation at the reset node V2. By the expression (3) and (4), the readout circuit 230 reads out the floating diffusion node V1 and the reset node V2 with the same charge level by turns on the switch SW after the first readout operation (CDS1).

$$V_{CDS} = ((V_{reset} - V_{signal}) + (V_{leak2} - V_{leak1}) \quad (5)$$

where $V_{CDS} \cong V_{reset} - V_{signal}, V_{leak1} \cong V_{leak2}$

By performing the double readout operation by the readout circuit 220, the source follower offset and the flicker noise are cancelled as shown in expression (5). In addition, the amount of back-side illumination structure light leakage in the floating diffusion node V1 and the reset node V2 are similar, therefore the light leakage is cancelled during the readout operation.

Figure 3:
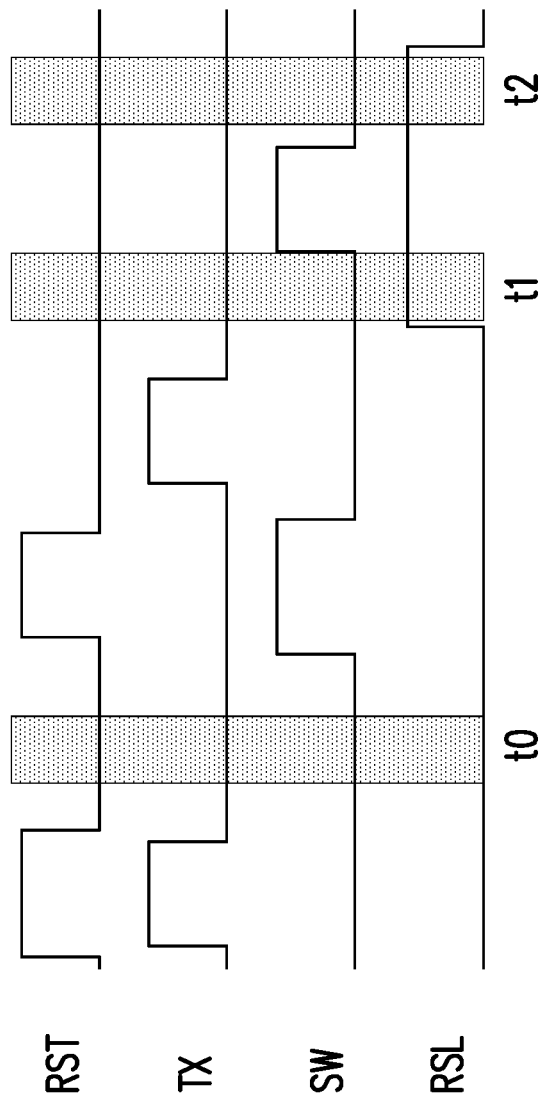
FIG. 3 illustrates operation waveforms of a CMOS image sensor according to an exemplary embodiment of the disclosure.

FIG. 3 illustrates operation waveforms of a CMOS image sensor according to an exemplary embodiment of the disclosure. As shown in FIG. 2 and FIG. 3, the transmitter transistor TX and the reset transistor RST are turned on to pass the charge flow from the photosensitive device 215 in the sensor 210. After the integration time t0, the transmitter transistor TX, the reset transistor RST, and the switch SW are turned on to store the first charge signal and the first reset signal in separate nodes, the floating diffusion node V1 and the reset node V2 respectively. During the first readout operation (CDS1), the readout circuit 230, reads out the first charge signal and the first reset signal simultaneously in the first predetermined time t1. The first readout operation is performed based on the expression (1) and (2). After the first readout operation, the readout circuit 220 turns on the switch SW to obtain a common-mode signal by making the first reset signal equal to the first charge signal. After obtaining the common-mode signal, the readout circuit 220 re-performs a second readout operation (CDS2) by reading out the common-mode signal at a second predetermined time t2. The first readout operation is performed based on the expression (3) and (4). By performing the double readout operation by the readout circuit 220 the source follower offset and the flicker noise are cancelled as shown in expression (5). In addition, the amount of back-side illumination structure light leakage in the floating diffusion node V1 and the reset node V2 are similar, therefore the light leakage is cancelled during the readout operation.

Figure 4:
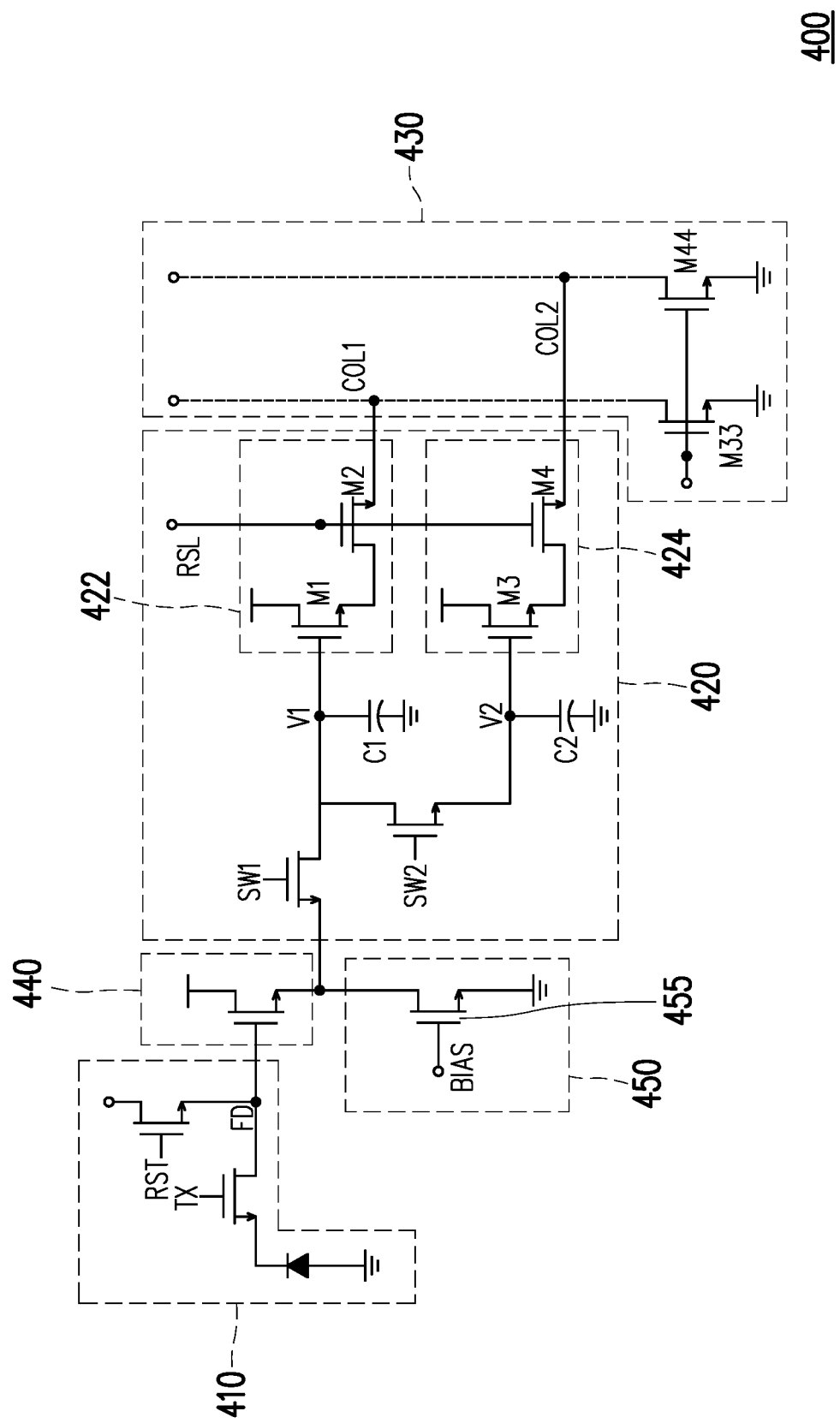
FIG. 4 illustrates a schematic circuit diagram of a CMOS image sensor according to another exemplary embodiment of the disclosure.

FIG. 4 illustrates a schematic circuit diagram of a CMOS image sensor 400 according to another exemplary embodiment of the disclosure. The CMOS image sensor 400 is also defined as 10T voltage domain global shutter (VDGS) CMOS image sensor. The "10T" defines the number of active transistors presented in the structure. The CMOS image sensor 400 used in the exemplary embodiment is a voltage domain, thus the CMOS image sensor 400 uses voltage signal instead of charge signal with reference to FIG. 2. Referring to FIG. 4, the CMOS image sensor 400 includes a sensor 410 is similar to a sensor 210 with reference to FIG. 2, thus the detailed description of these circuit is omitted herein. The transmitter transistor TX receives the control signal to turn on the transmitter transistor TX, which transfers the voltage accumulated in the photosensitive device 415 to a floating diffusion node (FD) V1.

The CMOS image sensor 400 further includes a readout circuit 420, a column readout circuit 430, a connection circuit 440, and a bias 450. The connection circuit 440 includes a connection transistor 444 is configured to couple the sensor 410 and the readout circuit 420. The bias 450 having a bias transistor 455 is configured to generate a bias voltage to the CMOS image sensor 400. The connection transistor 444 and the bias transistor 455 are N-type Metal-Oxide-Semiconductor (NMOS) transistors, but the type of the transistors and the number of transistors are not limited in the disclosure. In some embodiments, the connection transistor 444 and the bias transistor 455 forms a source follower circuit, where the drain terminal of the connection transistor 444 is directly coupled to the drain terminal of the bias transistor 455. The source follower circuit formed by the connection transistor 444 and the bias transistor 455 is also defined as the first stage source follower in the CMOS image sensor 400. In some embodiments the bias transistors 455 may turned off after the charge transfer from the source 410 to the floating diffusion node V1 and the reset node V2.

The readout circuit 420 further includes a first source follower 422 and a second source follower 424 and a plurality of switches (SW1, SW2). The plurality of switches includes a first switch SW1 and a second switch SW2. The first switch SW1 is configured to store the first voltage signal in a first capacitor C1. The second switch SW2 is configured to store the first reset signal in a second capacitor C2. Both the first capacitor C1 and the second capacitor C2 are a parasitic capacitor or a high density MIM capacitor, hence the type of capacitor used in the disclosure is not limited thereto. With reference to FIG. 4, the first source follower (SF1) 422, the second source follower (SF2) 424, and the column readout circuit 430 in the exemplary embodiment is similar with reference to FIG. 2, thus the detailed description of these circuit structures are omitted herein.

After the integration time, the first voltage signal and the first reset signal are stored in separate voltage nodes, the floating diffusion node V1 and the reset node V2 respectively by turning on the reset transistor RST, the transmitter transistor TX, the bias, the first switch SW1 and the second switch SW2. The readout circuit 420 is configured to perform a first readout operation (CDS1) by readout a first reset signal and a first voltage signal simultaneously at a first predetermined time, where the first predetermined time is the time taken to perform the first readout operation by the readout circuit 420. In detail, during the first predetermined time the reading out time of the first reset signal and the reading out time of the first charge signal simultaneously at the same time. During the first readout operation (CDS1) the output signal of the column readout circuit 420 is calculated as in expression (1) and (2).

After the first readout operation, the readout circuit 420 turns on the second switch SW2 to make the first reset signal equal to the first voltage signal. In other words, the voltage level of the first reset signal and the first voltage signal is same after the first readout operation by turning on the second switch SW2 to obtain a common-mode signal. After obtaining the common-mode signal, the readout circuit 420 re-performs a second readout operation (CDS2) by readout the common mode signal at a second predetermined time, where the second predetermined time is the time taken to perform the second readout operation by the readout circuit 420. The first predetermined time and the second predetermined is performed at different times. The second predetermined time is always after the first predetermined time. In other words, the first predetermined time and the second predetermined time do not overlap each other. During the second readout operation (CDS2) the output signal of the column readout circuit 420 is calculated as shown in expression (3) and (4). The total readout operation performed by the CMOS image sensor is calculated as $$(V_{COL1(CDS2)} - V_{COL1(CDS1)}) - (V_{COL2(CDS2)} - V_{COL2(CDS1)}) \rightarrow \quad (6)$$

Equation (6) shows the total readout operation performed by the CMOS image sensor 400 by calculating difference between the first readout operation (CDS1) and the second readout operation (CDS2) performed at the floating diffusion node V1 and the reset node V2. By performing the double readout operation the source follower offset and the flicker noise are cancelled as shown in expression (5).

Figure 5:
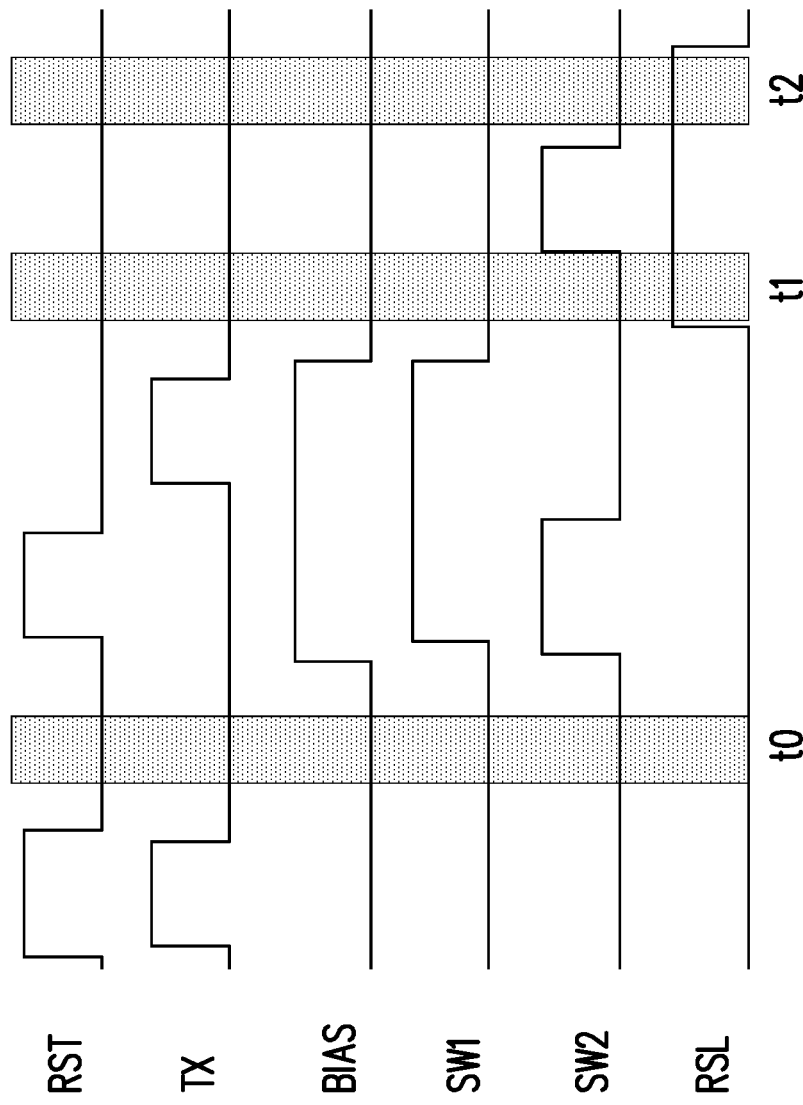
FIG. 5 illustrates operation waveforms of a CMOS image sensor according to an exemplary embodiment of the disclosure.

FIG. 5 illustrates operation waveforms of a CMOS image sensor according to an exemplary embodiment of the disclosure. As shown in FIG. 4, a transmitter transistor TX and a reset transistor RST are turned to pass the charge flow from a photosensitive device 415 in a sensor 410. After the integration time t0, the transmitter transistor TX, the reset transistor RST, a bias transistor 455, a first switch SW1, and a second switch SW2 are turned on to store the first voltage signal and the first reset signal in a first capacitor C1, and second capacitor C2. The charge at the first capacitor C1 and the second capacitor C2 are voltage signal at the floating diffusion node V1 and the reset node V2 respectively. During the first readout operation (CDS1), the readout circuit 420 reads out the first voltage signal and the first reset signal simultaneously in the first predetermined time t1. The first readout operation is performed based on the expression (1) and (2). After the first readout operation, the readout circuit 420 turns on the second switch SW2 to obtain a common-mode signal by making the first reset signal equal to the first voltage signal. After obtaining the common-mode signal, the readout circuit 420 re-performs a second readout operation (CDS2) by reading out the common-mode signal at a second predetermined time t2. The first readout operation is performed based on the expression (3) and (4). By performing the double readout operation the source follower offset and the flicker noise are cancelled as shown in expression (5). In addition, the amount of back-side illumination structure light leakage in each storage nodes V1 and V2 are similar, therefore the light leakage is cancelled during the readout operation.

Figure 6:
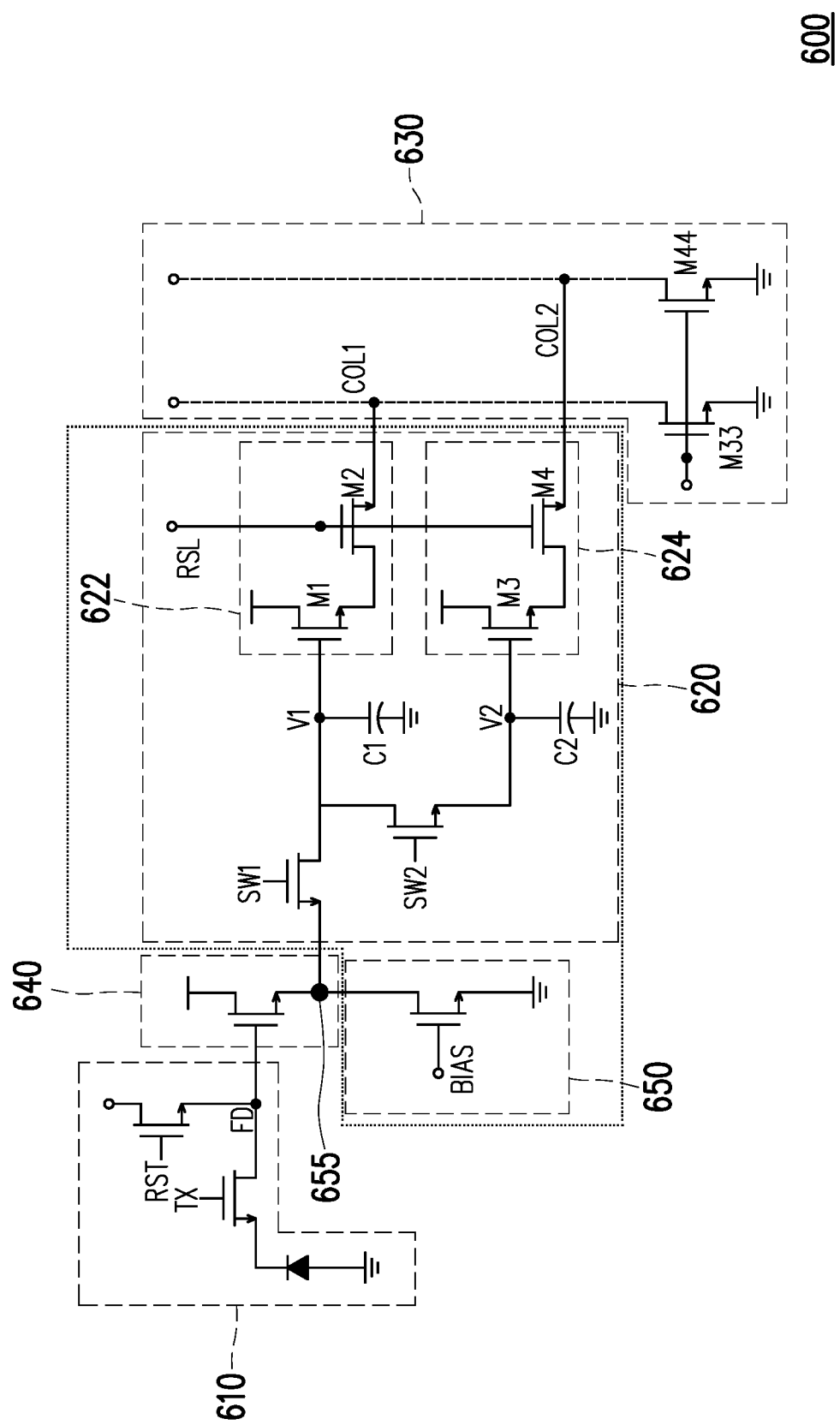
FIG. 6 illustrates a schematic circuit diagram of a CMOS image sensor according to another exemplary embodiment of the disclosure.

FIG. 6 illustrates a schematic circuit diagram of a CMOS image sensor 600 according to another exemplary embodiment of the disclosure. The CMOS image sensor 600 is also defined as 3T+7T voltage domain global shutter (VDGS) CMOS image sensor. The term "3T" defines the number of active transistors presented in top layer of the 3D layout and "7T" defines the number of active transistors presented in bottom layer of the 3D layout. Referring to FIG. 6, the CMOS image sensor includes a sensor 610, a readout circuit 620, a column readout circuit 630, a connection circuit 640, and a bias 650 in the exemplary embodiment is similar to a sensor 410, a readout circuit 420, a column readout circuit 430, a connection circuit 440, and a bias 450 with reference to FIG. 4, thus the detailed description of these circuits are omitted herein. The top layer and the bottom layer of the CMOS image sensor 600 is coupled by the 3D hybrid bond 655 located between the connection circuit 640 and the bias 650. The sensor 610 and the connection circuit 640 are placed in the top layer of the 3D layout. Conversely, the readout circuit 630 is placed in the bottom layer of the 3D layer. The main function of placing the circuits in the bottom layer is to give the bottom layer light shielding, which in turn may reduce the light leakage. By placing the circuits in the bottom layer shielding the amount of light leakage is negligible in addition to the parasitic light sensitivity leakage cancellation by the double readout operation.

Figure 7:
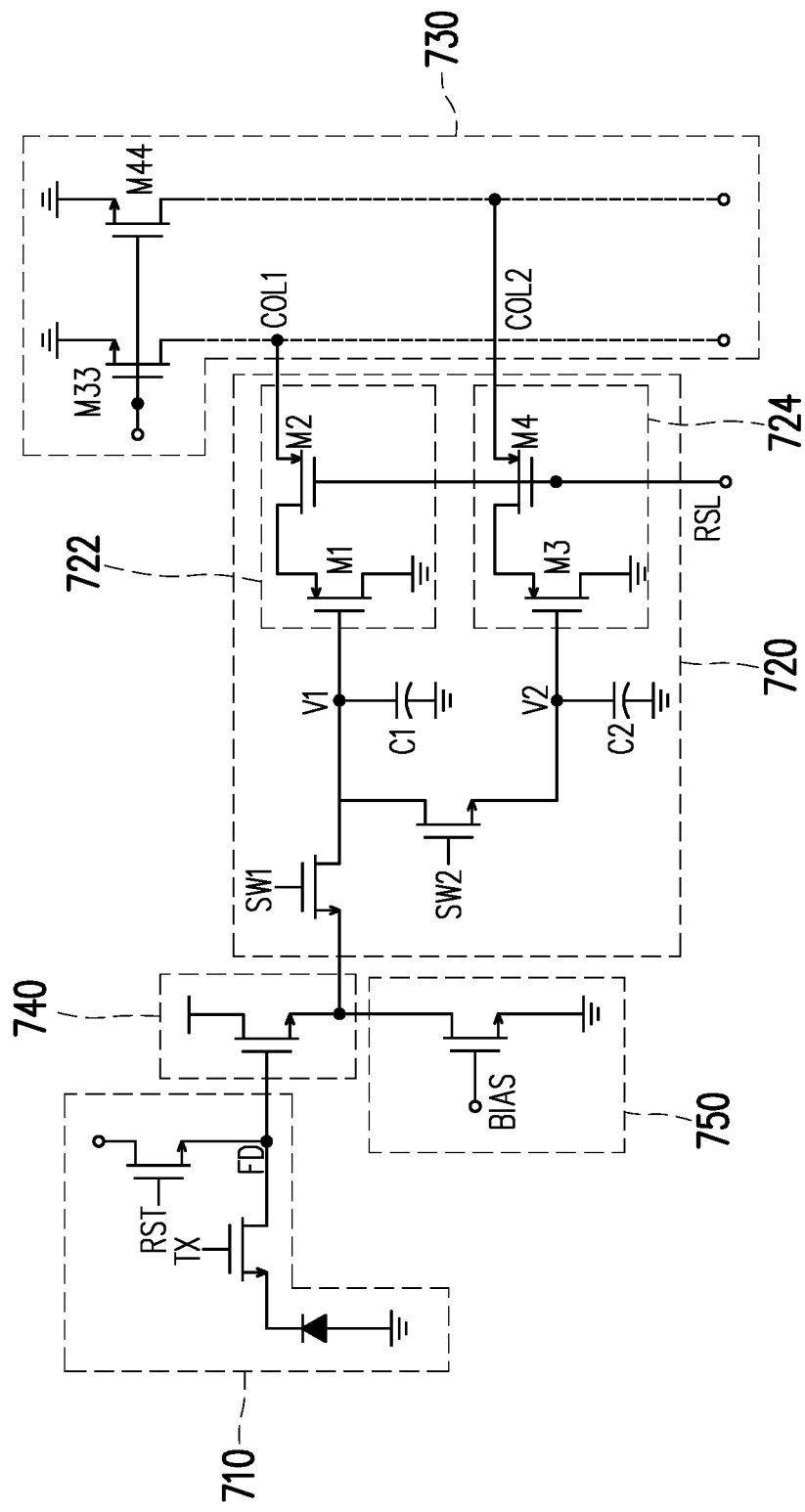
FIG. 7 illustrates a schematic circuit diagram of a CMOS image sensor according to another exemplary embodiment of the disclosure.

FIG. 7 illustrates a schematic circuit diagram of a CMOS image sensor 700 according to another exemplary embodiment of the disclosure. Referring to FIG. 7, the CMOS image sensor 700 having a sensor 710, a readout circuit 720, a column readout circuit 730, a connection circuit 740, and a bias 750 in the exemplary embodiment is similar with reference to FIG. 4, thus the detailed description of these circuits are omitted herein.

The readout circuit 730 further includes a first source follower (SF1) and a second source follower (SF2) are similar with reference to FIG. 4 except for the type of transistors. In the exemplary embodiment the transistors M1, M2, M3 and M4 in the first source follower (SF1) and the second source follower (SF2) are P-type CMOS transistors, and the operation sequence of performing the first readout operation (CDS1) and the second readout operation (CDS2) are similar with reference to FIG. 4. Similarly, the transistors M33 and M44 in the column read circuit 730 are P-type CMOS transistors, and the operation sequence of the column readout operation performed by column read circuit 730 is similar with reference to FIG. 4, thus the detailed description of these circuits are omitted herein.

Figure 8:
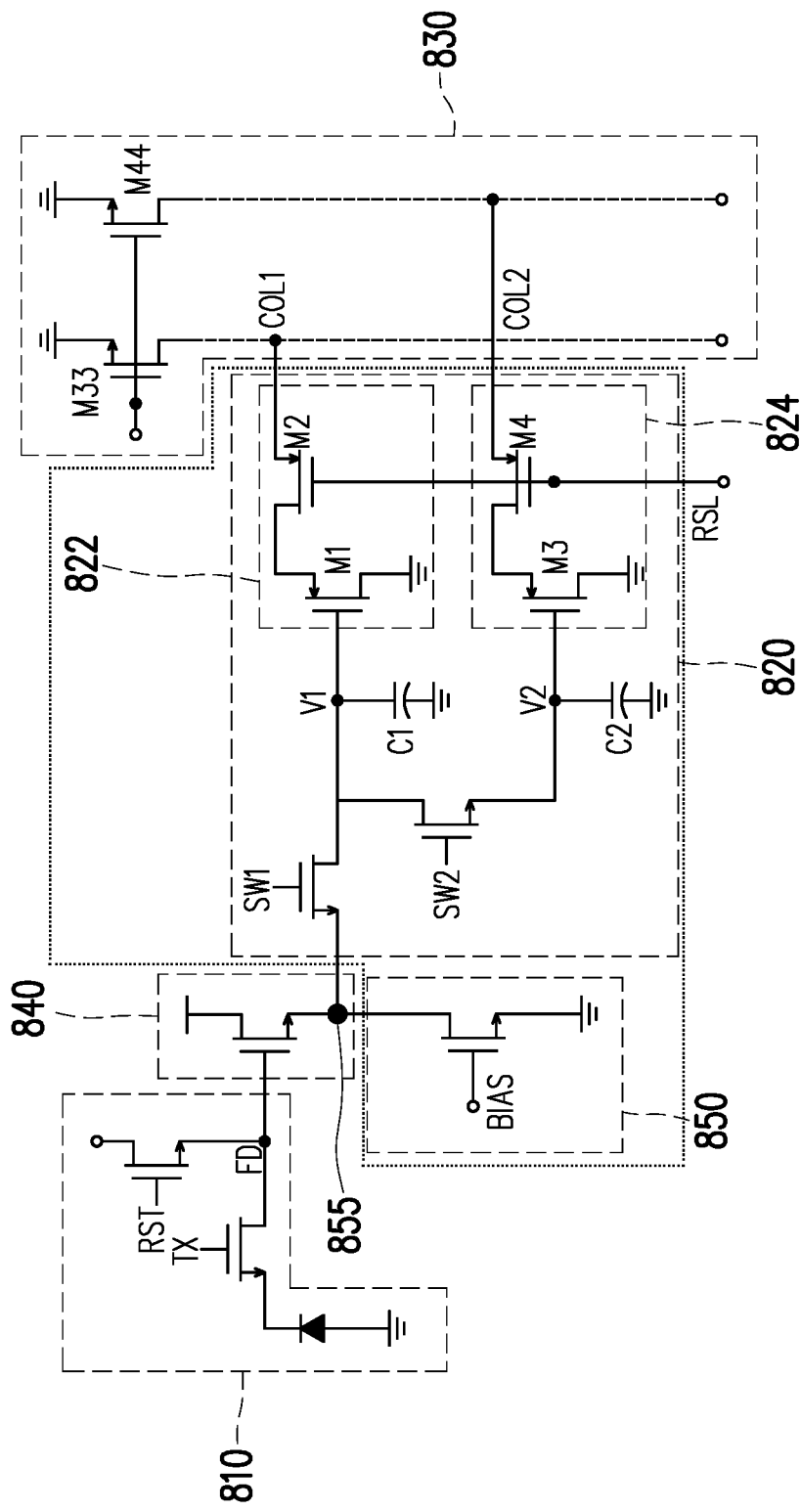
FIG. 8 illustrates a schematic circuit diagram of a CMOS image sensor according to another exemplary embodiment of the disclosure.

FIG. 8 illustrates a schematic circuit diagram of a CMOS image sensor 800 according to another exemplary embodiment of the disclosure. The CMOS image sensor 800 is also defined as 3T+7T voltage domain global shutter (VDGS) CMOS image sensor. The term "3T" defines the number of active transistors presented in top layer of the 3D layout and "7T" defines the number of active transistors presented in bottom layer of the 3D layout. Referring to FIG. 8, the CMOS image sensor includes a sensor 810, a readout circuit 820, a column readout circuit 830, a connection circuit 840, and a bias 850 in the exemplary embodiment is similar with reference to FIGS. 4 and 7, thus the detailed description of the circuit is omitted herein. The top layer and the bottom layer of the CMOS image sensor 800 is coupled by the 3D hybrid bond 855 located between the connection circuit 840 and the bias 850. The sensor 810 and the connection circuit 840 are placed in the top layer of the 3D layout. Conversely, the readout circuit 820 is placed in the bottom layer of the 3D layer. The main function of placing the circuits in the bottom layer is to give the bottom layer light shielding, which in turn may reduce the light leakage. By placing the circuits in the bottom layer shielding the amount of light leakage is negligible in addition to the parasitic light sensitivity leakage cancellation by double readout operation.

Figure 9:
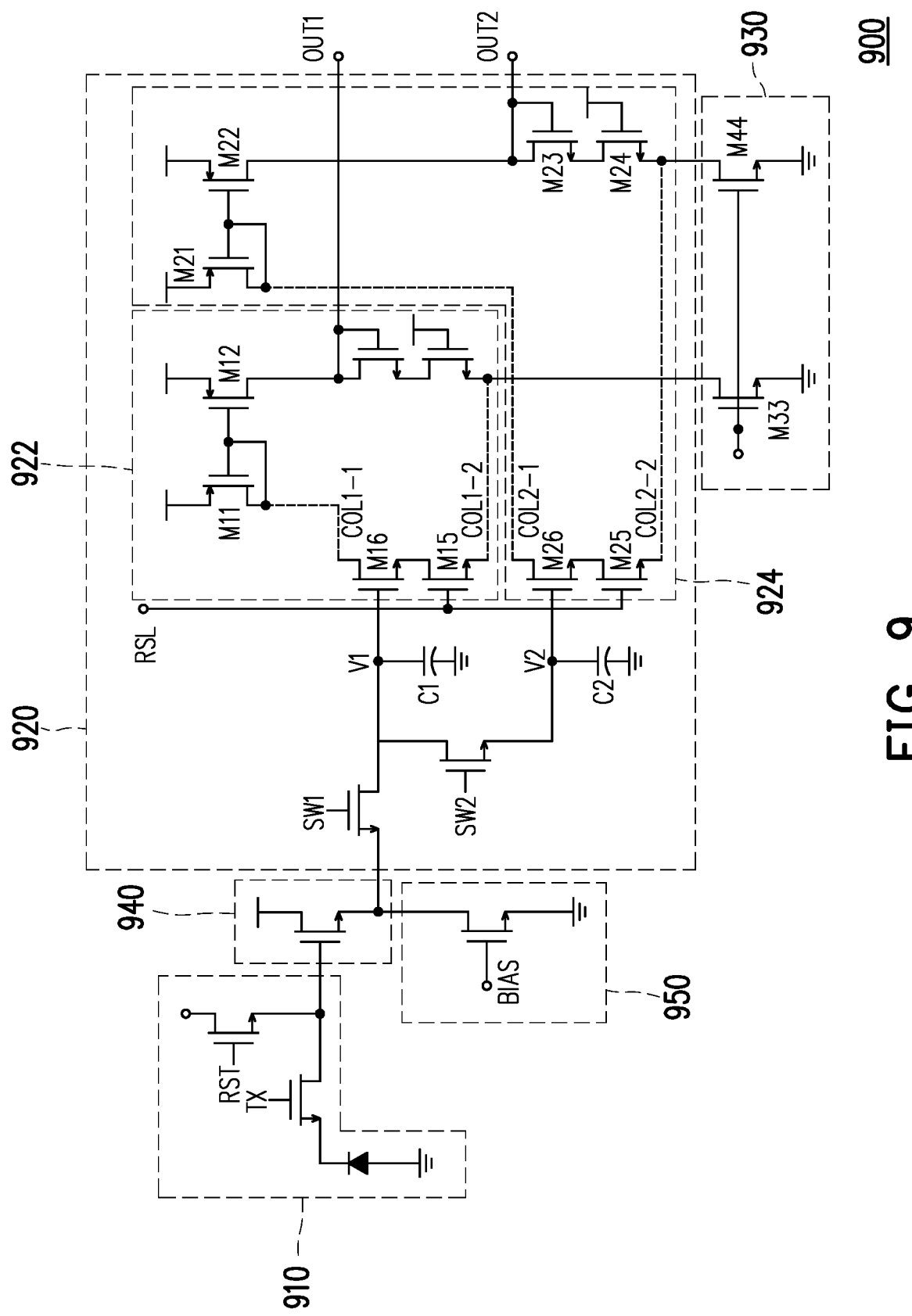
FIG. 9 illustrates a schematic circuit diagram of a CMOS image sensor according to another exemplary embodiment of the disclosure.

FIG. 9 illustrates a schematic circuit diagram of a CMOS image sensor 900 according to another exemplary embodiment of the disclosure. Referring to FIG. 9, the CMOS image sensor 900 having a sensor 910, a readout circuit 920, a column readout circuit 930, a connection circuit 940, and a bias 950 in the exemplary embodiment is similar with reference to FIG. 4, thus the detailed description of these circuits are omitted herein.

The readout circuit 920 further includes a first switch SW1, a second switch SW2, a first capacitor C1, a second capacitor C2, a first unity gain buffer (UB1) 922, and a second unity gain buffer (UB2) 924. The circuit structure of the first switch SW1, the second switch SW2, the first capacitor C1, and the second capacitor C2 is similar to the structure with reference to FIG. 4, thus the detailed description of these circuits are omitted herein.

The first unity gain buffer 922 having a plurality of transistors M11, M12, M13, M14, M15, and M16 forms a unity gain buffer, where M11 and M12 are P-type CMOS transistors and other transistors are N-type CMOS transistors. Similarly, the second unity gain buffer 924 having a plurality of transistors M21, M22, M23, M24, M25, and M26, which forms a unity gain buffer, where M21 and M22 are P-type CMOS transistors and other transistors are N-type CMOS transistors. The structure of the unity gain buffer is similar to the conventional unity gain buffer; thus, the detail description of the unity gain buffer structure and the operations are omitted herein. The design of unity gain buffer is not limited to the conventional structure and the structure is a determined according to the designer requirement.

The readout operation performed by the first unity gain buffer 922, and the second unity gain buffer 924 during the first readout operation (CDS1) and the second readout operation (CDS2) are similar to the readout operation performed by the first source follower (SF1) and the second source follower (SF2) with reference to FIG. 4, thus the detailed description of the readout operation performed by the first unity gain buffer 922 and the second unity gain buffer 924 are omitted herein.

Figure 10:
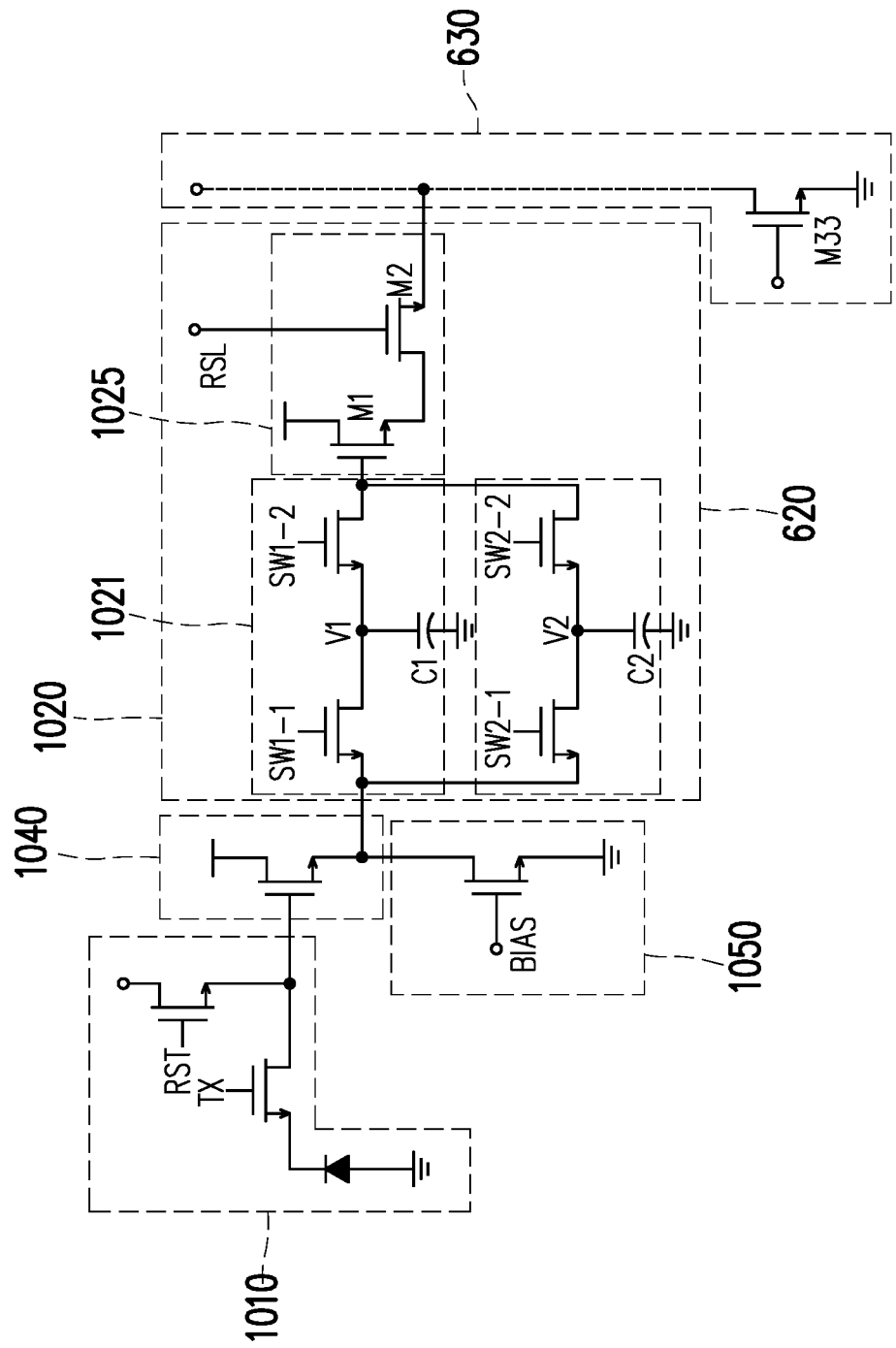
FIG. 10 illustrates a schematic circuit diagram of a CMOS image sensor according to another exemplary embodiment of the disclosure.

FIG. 10 illustrates a schematic circuit diagram of a CMOS image sensor 1000 according to another exemplary embodiment of the disclosure. Referring to FIG. 10, the CMOS image sensor 1000 having a sensor 1010, a readout circuit 1020, a column readout circuit 1030, a connection circuit 1040, and a bias 1050 in the exemplary embodiment is similar with reference to FIG. 4, thus the detailed description of these circuits is omitted herein.

The readout circuit 1020 further includes a first pair of switches 1021, a second pair of switches 1022, a first capacitor C1, a second capacitor C2, and a source follower (SF) 1025. The first pair of switches having a first switch SW1-1, and a second switch SW1-2. Similarly, the second pair of switches 1022 having a third switch SW2-1, and a fourth switch SW2-2. The first capacitor C1 is coupled between the first switch SW1-1 and the second switch SW1-2. Similarly, the second capacitor C2 is coupled between the third switch SW2-1 and the fourth switch SW2-2. The one terminal of the first switch SW1-1 and the third switch SW2-1 are coupled with the connection circuit 1040, while the other end is coupled to the first capacitor C1 and the second capacitor C2 respectively. Similarly, the one terminal of the second switch SW1-2 and the fourth switch SW2-2 are coupled with the source follower 1025, while the other end is coupled to the first capacitor C1 and the second capacitor C2 respectively. The first pair of switches 1021 and the second pair of switches 1022 are selectively turned on and off to charge and discharge during the readout operation. The source follower (SF) 1025 is similar to the first source follower (SF1) with reference to FIG. 4. The column readout circuit 1030 have a transistor M33 configured to drive the corresponding column in response to the readout operation performed by the readout circuit 1020. The readout circuit 1020 performs the double readout operation by selectively reading out twice by the source follower 1025 during the readout operation instead of two source followers used in exemplary embodiment with reference to FIG. 4. The total readout operation performed by the CMOS image sensor is calculated as $$(V_{COL(CDS1)} - V_{COL(CDS2)}) \rightarrow \qquad (7)$$

Equation (7) shows total readout operation performed by the CMOS image sensor 1000 by calculating difference between the first readout operation (CDS1) at the floating diffusion node V1 and the reset node V2 twice by the source follower 1025 and the second readout operation (CDS2) performed at the floating diffusion node V1 and the reset node V2 twice by the source follower 1025. By performing the double readout operation by the readout circuit 1020, the source follower offset and the flicker noise are cancelled as shown in expression (5).

In some embodiments the top layer and the bottom layer of the CMOS image sensor 1000 are coupled by the 3D hybrid bond located between the connection circuit 1040 and the bias 1050. The sensor 1010 and the connection circuit 1040 are placed in the top layer of the 3D layout. Conversely, the readout circuit 1030 is placed in the bottom layer of the 3D layer. The main function of placing the circuits in the bottom layer is to give the bottom layer light shielding, which in turn may reduce the light leakage. By placing the circuits in the bottom layer shielding the amount of light leakage is negligible in addition to the parasitic light sensitivity leakage cancellation by double readout operation.

Figure 11:
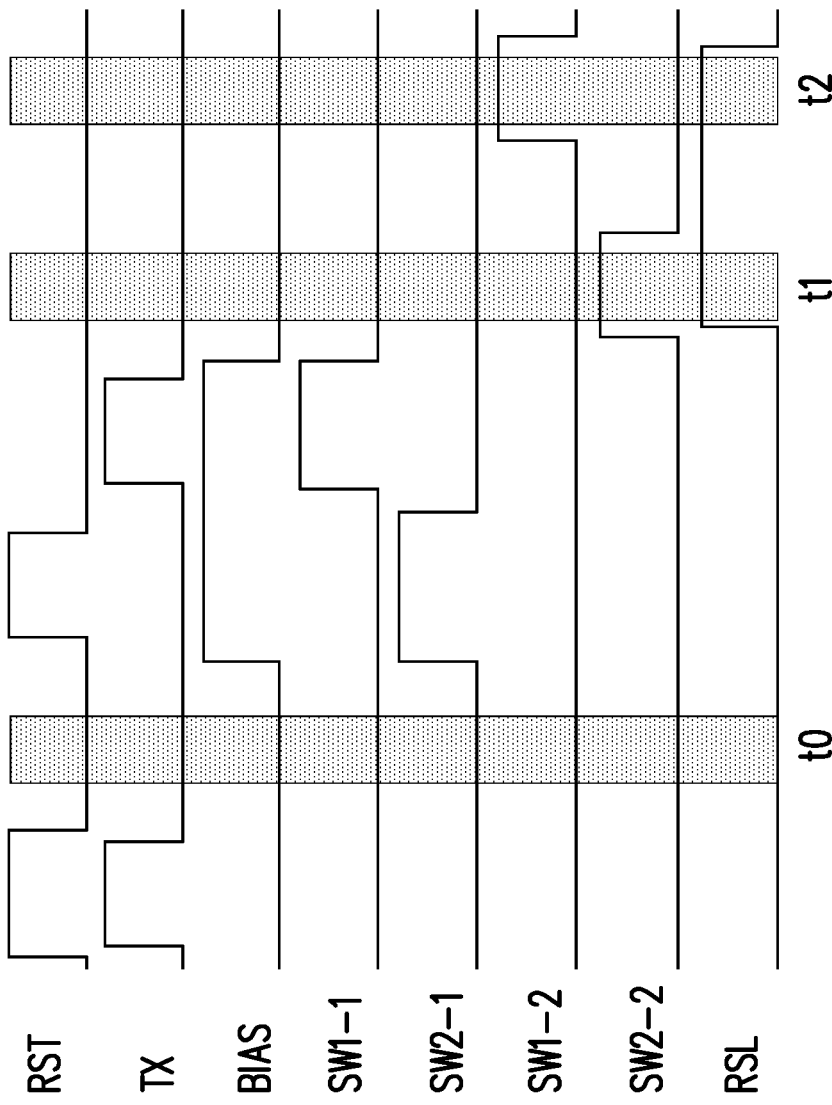
FIG. 11 illustrates operation waveforms of a CMOS image sensor according to an exemplary embodiment of the disclosure.

FIG. 11 illustrates operation waveforms of a CMOS image sensor according to an exemplary embodiment of the disclosure. As shown in FIG. 10, the transmitter transistor TX and the reset transistor RST are turned to pass the charge flow from the photosensitive device 1015 in the sensor 1010. After the integration time t0, a transmitter transistor TX, a reset transistor RST, a bias transistor, a first switch SW1-1, and a third switch SW2-1 are turned on to store the first voltage signal and the first reset signal in a first capacitor C1, and second capacitor C2. The charge at the first capacitor C1 and the second capacitor C2 are voltage signal at the floating diffusion node V1 and the reset node V2 respectively. During the first readout operation (CDS1), the readout circuit 1020, readout the first voltage signal and the first reset signal twice at the first predetermined time t1. The first readout operation is performed based on the expression (1) and (2). After the first readout operation, the readout circuit 1020 turns on a third switch SW1-2, and a fourth switch SW2-2 to make the first reset signal equal to the first voltage signal to obtain the common-mode signal. After obtaining the common-mode signal, the readout circuit 1020 re-performs a second readout operation (CDS2) by readout the common-mode signal twice at a second predetermined time t2. The first readout operation is performed based on the expression (3) and (4). By performing the double readout operation by the readout circuit the source follower offset and the flicker noise are cancelled as shown in expression (5). In addition, the amount of back-side illumination structure light leakage in each storage nodes V1 and V2 are similar, therefore the light leakage is cancelled during the readout operation.

Figure 12:
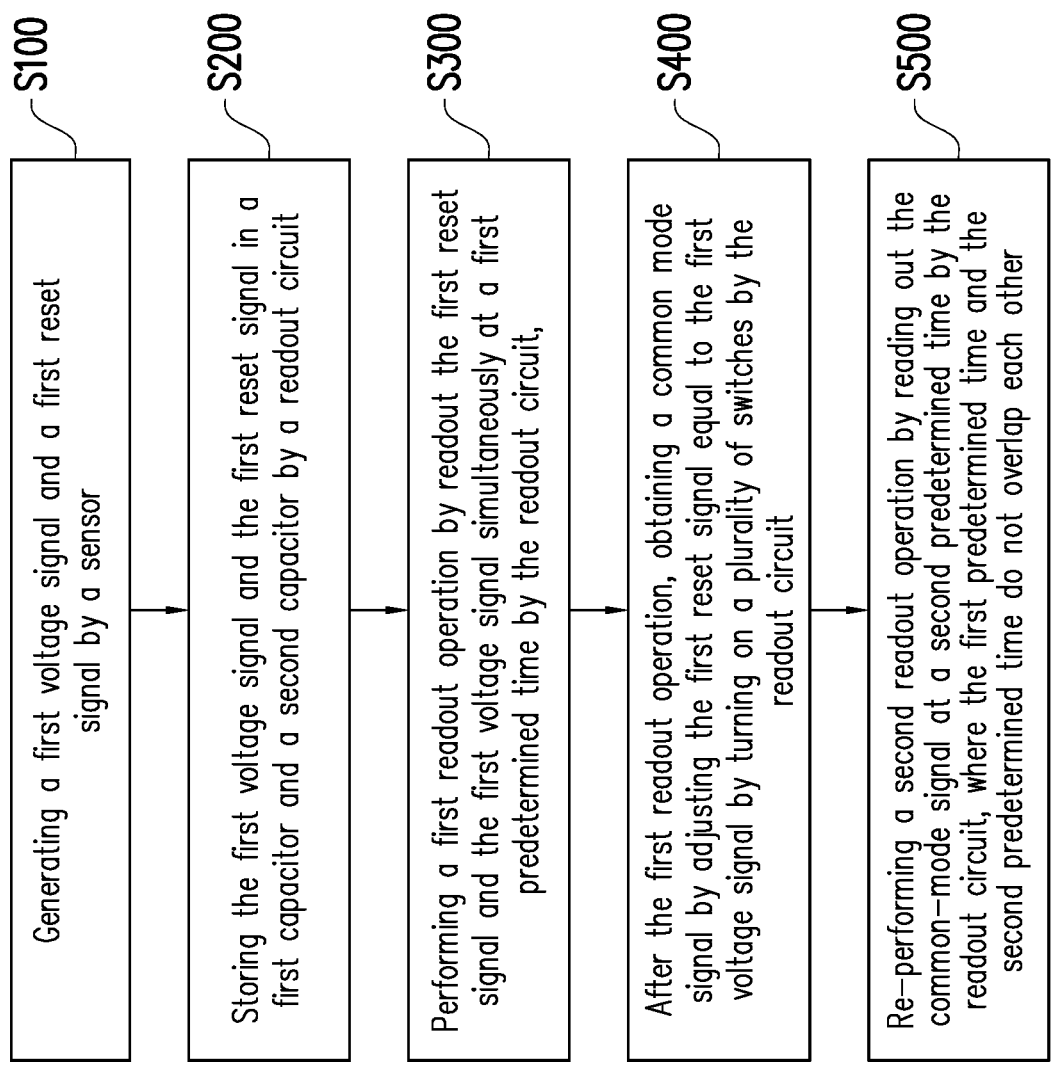
FIG. 12 is a flow chart illustrating a method of operating a pixel array by a CMOS image sensor according to an exemplary embodiment of the disclosure.

FIG. 12 is a flow chart illustrating a method of operating a pixel array by a CMOS image sensor according to an exemplary embodiment of the disclosure. In step S100, generating a first voltage signal and a first reset signal by a sensor. After generating the first voltage signal and the first reset signal, in step S200 storing the first voltage signal and the first reset signal in a first capacitor and a second capacitor by a readout circuit. In step 300, performing a first readout operation by reading out the first reset signal and the first charge signal at a first predetermined time by the readout circuit. After the first readout operation, adjusting the first reset signal equal to the first voltage signal by turning on a switch by the readout circuit in step S400. In step S500, re-performing a second readout operation by reading out the first reset signal and the first voltage signal at a second predetermined time by the readout circuit. By the above double readout operation performed by the method of operating a pixel array by a CMOS image sensor, the source follower offset and the flicker noise are cancelled as shown in expression (5). In addition, the amount of back-side illumination structure light leakage in each storage nodes V1 and V2 are similar, therefore the light leakage is cancelled during the readout operation.

Figure 13:
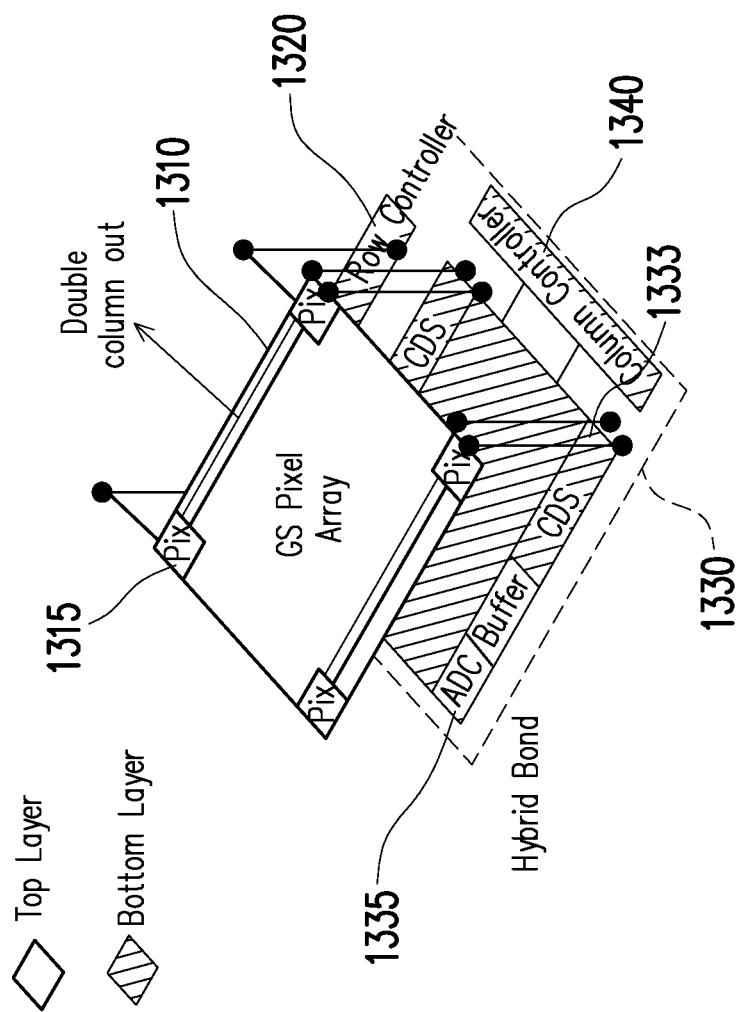
FIG. 13 illustrates a 3D layout block diagram of a CMOS image sensor according to an exemplary embodiment of the disclosure.

FIG. 13 illustrates a 3D layout block diagram of a CMOS image sensor 1300 according to an exemplary embodiment of the disclosure. The CMOS 1300 includes a global shutter pixel array 1310, a row controller 1320, a column controller 1340, and a readout circuit 1330 in the exemplary embodiment is similar with reference to FIG. 1. The top layer and the bottom layer of the CMOS image sensor 1300 is coupled by a 3D hybrid bond located between the global pixel sensor array 1310 and the readout circuit 1330. The global shutter (GS) pixel sensor array 1310 is placed in the top layer and the readout circuit 1330 is placed in the bottom layer of the 3D layout. The main function of placing the circuits in the bottom layer is to give the bottom layer light shielding, which in turn may reduce the light leakage. By placing the circuits in the bottom layer shielding the amount of light leakage is negligible in addition to the parasitic light sensitivity leakage cancellation by double readout operation.

Figure 14:
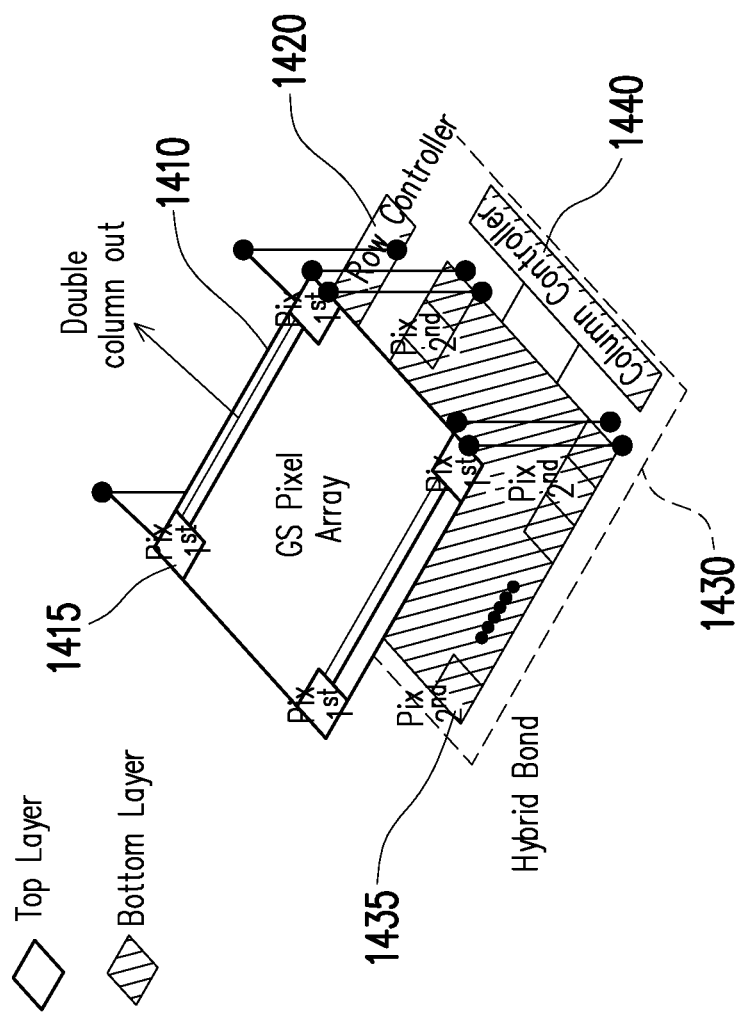
FIG. 14 illustrates a 3D layout block diagram of a CMOS image sensor according to an exemplary embodiment of the disclosure.

FIG. 14 illustrates a 3D layout block diagram of a CMOS image sensor 1400 according to an exemplary embodiment of the disclosure. The CMOS 1400 includes a global shutter pixel array 1410, a row controller 1420, a column controller 1440, and a readout circuit 1430 in the exemplary embodiment is similar with reference to FIGS. 1 and 13. The top layer and the bottom layer of the CMOS image sensor 1400 is coupled by a 3D hybrid bond located between the global shutter (GS) pixel array 1410 and the readout circuit 1430. In addition to the 3D hybrid bond between located between the global shutter pixel array 1410 and the readout circuit 1430, each of a correlated double sampling circuit (CDS) 1433 and an analog-to-digital converter (ADC) 1435 are hybrid bond between the each of the plurality of pixel (Pix) 1415 in the global shutter pixel array 1410. By having a plurality of hybrid bonds between each of a correlated double sampling circuit 1433, an analog-to-digital converter 1435 and the plurality of pixel 1415 in the global shutter pixel array 1410 the readout operation and the sensing speed of the CMOS image sensor 1400 is greatly improved. In addition, by placing the circuits in the bottom layer shielding the amount of light leakage is negligible in addition to the parasitic light sensitivity leakage cancellation by double readout operation.

According to some embodiments, the disclosure provides a CMOS image sensor which includes a sensor, and a readout circuit. The sensor is configured to generate a first voltage signal and a first reset signal. The readout circuit is configured to perform a first readout operation by reading out the first reset signal and the first voltage signal simultaneously at a first predetermined time. After the first readout operation, the readout circuit turns on a plurality of switches to obtain a common-mode signal by making the first reset signal equal to the first voltage signal and re-perform a second readout operation by reading out the common-mode signal at a second predetermined time. The first predetermined time and the second predetermined time do not overlap each other.

According to some embodiments, the disclosure provides a CMOS image sensor which includes a sensor, and a readout circuit. The sensor is configured to generate a first charge signal and a first reset signal. The readout circuit is configured to perform a first readout operation by reading out the first reset signal and the first charge signal simultaneously at a first predetermined time. After the first readout operation, the readout circuit turns on a switch to obtain a common-mode signal by making the first reset signal equal to the first charge signal and re-perform a second readout operation by reading out the common-mode signal at a second predetermined time. The first predetermined time and the second predetermined time do not overlap each other.

According to some embodiments, the disclosure provides a method of operating a pixel array by a CMOS image sensor comprising the steps of: generating a first voltage signal and a first reset signal by a sensor, storing the first voltage signal and the first reset signal in a first capacitor and a second capacitor by a readout circuit, performing a first readout operation by reading out the first reset signal and the first voltage signal at a first predetermined time by the readout circuit, after the first readout operation, obtaining a common-mode signal by adjusting the first reset signal equal to the first voltage signal by turning on a plurality of switches by the readout circuit, re-performing a second readout operation by reading out the common-mode signal at a second predetermined time by the readout circuit. The first predetermined time and the second predetermined time do not overlap each other.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A CMOS image sensor comprising:
   a sensor configured to generate a first voltage signal and a first reset signal;
   a readout circuit configured to perform a first readout operation by reading out the first reset signal and the first voltage signal simultaneously at a first predetermined time,
   wherein after the first readout operation, the readout circuit turns on a plurality of switches to obtain a common-mode signal by making the first reset signal equal to the first voltage signal and re-perform a second readout operation by reading out the common-mode signal at a second predetermined time,
   wherein the first predetermined time and the second predetermined time do not overlap each other,
   wherein the readout circuit comprises:
   a first source follower, having a first transistor and a second transistor,
   wherein a drain terminal of the first transistor and a drain terminal of the second transistor are coupled to each other; and
   a second source follower, having a third transistor and a fourth transistor,
   wherein a drain terminal of the third transistor and a drain terminal of the fourth transistor are coupled to each other.

2. The CMOS image sensor of claim 1, the readout circuit further comprising:
   a first unit gain buffer, configured to receive the first voltage signal; and
   a second unit gain buffer, configured to receive the first reset signal.

3. The CMOS image sensor of claim 1, further comprising:
   a connection circuit, having a connection transistor configured to couple the sensor and the readout circuit;
   a bias, configured to generate a bias voltage to the CMOS image sensor.

4. The CMOS image sensor of claim 3, wherein the CMOS image sensor layout is a 3D layout,
   the sensor is placed in top layer in the 3D layout and the readout circuit is placed in bottom layer in the 3D layout.

5. The CMOS image sensor of claim 3, wherein the CMOS image sensor layout is a 2D layout,
   the sensor and the readout circuit in the same layer in the 2D layout.

6. The CMOS image sensor of claim 3, the readout circuit further comprising:
   a first switch, configured to store the first voltage signal in a first capacitor;
   a second switch, configured to store the reset signal in a second capacitor.

7. The CMOS image sensor of claim 6, the second stage source follower further comprising:

a control terminal of the first transistor and a control terminal of the third transistor are configured to receive the first reset signal and the first voltage signal; and a control terminal of the second transistor and a control terminal of the fourth transistor are configured to receive a row select signal.

8. The CMOS image sensor of claim 3, wherein
the first source follower is a NMOS source follower; and
the second source follower is a NMOS source follower.

9. The CMOS image sensor of claim 3, wherein
the first source follower is a PMOS source follower; and
the second source follower is a PMOS source follower.

10. The CMOS image sensor of claim 3, further comprising
a column readout circuit, having a plurality of transistors configured to drive the corresponding column in response to the readout operation performed by the readout circuit.

11. The CMOS image sensor of claim 2, wherein
a first switch, configured to store the first voltage signal in a first capacitor;
a second switch, configured to store the reset signal in a second capacitor.

12. The CMOS image sensor of claim 2, further comprising
a column readout circuit, having a plurality of transistors configured to drive the corresponding column in response to the readout operation performed by the readout circuit.

13. The CMOS image sensor of claim 3, further comprising:
a first plurality of switches, configured to store the first voltage signal in a first capacitor; and
a second plurality of switches, configured to store the reset signal in a second capacitor.

14. The CMOS image sensor of claim 3, wherein
the source follower readout twice during the first readout operation to readout the first reset signal and the first voltage signal at the first predetermined time,
the source follower readout twice during the second readout operation to readout the first reset signal and the first voltage signal at the second predetermined time.

15. The CMOS image sensor of claim 2, further comprising
a column readout circuit, a column read transistor configured to drive the corresponding column in response to the readout operation performed by the readout circuit.

16. A CMOS image sensor comprising:
a sensor configured to generate a first charge signal and a first reset signal;
a readout circuit configured to perform a first readout operation by reading out the first reset signal and the first charge signal simultaneously at a first predetermined time,
wherein after the first readout operation, the readout circuit turns on a switch to obtain a common-mode signal by making the first reset signal equal to the first charge signal and re-perform a second readout operation by reading out the common-mode signal at a second predetermined time,
wherein the first predetermined time and the second predetermined do not overlap each other,
wherein the readout circuit comprises:
a first source follower, having a first transistor and a second transistor,
wherein a drain terminal of the first transistor and a drain terminal of the second transistor are coupled to each other; and
a second source follower, having a third transistor and a fourth transistor,
wherein a drain terminal of the third transistor and a drain terminal of the fourth transistor are coupled to each other.

17. The CMOS image sensor of claim 16, wherein
a control terminal of the first transistor and a control terminal of the third transistor are configured to receive the reset signal and the first charge signal, and
a control terminal of the second transistor and a control terminal of the fourth transistor are configured to receive a row select signal.

18. A method of operating a pixel array by a CMOS image sensor comprising the steps of:
generating a first voltage signal and a first reset signal by a sensor;
storing the first voltage signal and the first reset signal in a first capacitor and a second capacitor by a readout circuit;
performing a first readout operation by reading out the first reset signal and the first voltage signal at a first predetermined time by the readout circuit;
after the first readout operation, obtaining a common-mode signal by adjusting the first reset signal equal to the first voltage signal by turning on a plurality of switches by the readout circuit; and
re-performing a second readout operation by reading out the common-mode signal at a second predetermined time by the readout circuit,
wherein the first predetermined time and the second predetermined time do not overlap each other,
wherein the readout circuit comprises:
a first source follower, having a first transistor and a second transistor,
wherein a drain terminal of the first transistor and a drain terminal of the second transistor are coupled to each other; and
a second source follower, having a third transistor and a fourth transistor, wherein a drain terminal of the third transistor and a drain terminal of the fourth transistor are coupled to each other.

* * * * *